(12) United States Patent
Park

(10) Patent No.: US 7,037,858 B2
(45) Date of Patent: May 2, 2006

(54) METHOD FOR MANUFACTURING SEMICONDUCTOR DEVICE INCLUDING AN OZONE PROCESS

(75) Inventor: Geon-Ook Park, Seoul (KR)

(73) Assignee: DongbuAnam Semiconductor Inc., Seoul (KR)

( * ) Notice: Subject to any disclaimer, the term of this patent is extended or adjusted under 35 U.S.C. 154(b) by 104 days.

(21) Appl. No.: 10/680,135

(22) Filed: Oct. 8, 2003

(65) Prior Publication Data

US 2004/0087071 A1 May 6, 2004

(30) Foreign Application Priority Data

Oct. 9, 2002 (KR) ...................... 10-2002-0061429

(51) Int. Cl.
*H01L 21/469* (2006.01)
(52) U.S. Cl. .................................... 438/763
(58) Field of Classification Search ................ 438/197, 438/618, 643, 682, 761–763, 778
See application file for complete search history.

(56) References Cited

U.S. PATENT DOCUMENTS

| | | | |
|---|---|---|---|
| 6,420,752 B1 | 7/2002 | Ngo et al. | |
| 6,475,847 B1 | 11/2002 | Ngo et al. | |
| 6,861,104 B1 * | 3/2005 | Wu et al. | 427/539 |
| 2003/0054623 A1 * | 3/2003 | Weimer et al. | 438/587 |

FOREIGN PATENT DOCUMENTS

KR  2001-0094843  11/2001

OTHER PUBLICATIONS

B. Mayer, "Small Signal Analysis of Source Vapor Control Requirements for APCVD", Aug. 1996, vol. 9, Issue 3, pp. 344-365.*
K. Fujino et al., "Reaction Mechanism of TEOS and O3 Atmospheric Pressure CVD", Jun. 1991, Eighth International IEEE VLSI Multilevel Interconnection Conference, pp. 445-447.*
P. Lee et al., Sub-Atmospheric Chemical Vapor Deposition (SACVD) of TEOS-Ozone USG and BPSG, Jun. 1990, Seventh International IEEE VLSI Multilevel Interconnection Conference, pp. 396-398.*
Y. Nishimoto et al., "Dielectric Film Deposition by Atmospheric Pressure and Low Temperature CVD using TEOS, Ozone and New Organometallic Doping Sources", Jun. 1989, VMIC Conference, pp. 382-389.*

* cited by examiner

*Primary Examiner*—Evan Pert
(74) *Attorney, Agent, or Firm*—Pillsbury Winthrop Shaw Pittman LLP

(57) ABSTRACT

A method for manufacturing a semiconductor device includes forming a barrier layer on an individual device formed on a semiconductor substrate and including a MOS transistor. An ozone process is performed on the barrier layer. A pre-metal dielectric (PMD) layer is then formed on the barrier layer.

19 Claims, 3 Drawing Sheets

METHOD FOR MANUFACTURING SEMICONDUCTOR DEVICE INCLUDING AN OZONE PROCESS

BACKGROUND OF THE INVENTION (a) Field of the Invention

The present invention relates to a method for manufacturing a MOS (metal oxide semiconductor) transistor. More particularly, the present invention relates to a method for manufacturing a MOS transistor in which a silicon nitride layer is formed to prevent impurities from a pre-metal dielectric layer from diffusing into the transistor.

(b) Description of the Related Art

There are two general classes of field effect transistors (FETs), and they include the MOSFET and the JFET (junction FET). The present invention is related to the MOSFET, which typically includes the electrodes of a source, a drain, and a gate on a semiconductor substrate. Metal interconnect lines are connected to upper areas of the source, drain, and gate to enable the application of electrical signals to the same. The areas where such connections are made are referred to as contacts.

To enable ohmic contact of each of the electrodes, that is, to minimize the resistance of each of the electrodes, silicide films are formed between the metal interconnect lines; and each electrode of the source, drain, and gate. Also, a silicon nitride film is deposited over an entire upper surface of the transistor including on the silicide films. The silicon nitride film acts as an etch stop layer during etching to form contacts and to prevent the diffusion of impurities from a BPSG (boron phosphorous silicate glass) layer into other elements.

A conventional method for manufacturing a MOS transistor will be described with reference to FIGS. 1a through 1c.

Referring first to FIG. 1a, oxide layer 3 as a gate oxide and polysilicon for use as a gate electrode 4 are formed at a predetermined width on a surface of a device region of a silicon wafer 1. The device region of the silicon wafer 1 is defined by a field oxide layer 2, which is formed by a LOCOS (local oxidation of silicon) process or a trench process. Next, using the gate electrode 4 as a mask, ion injection using a p-type or n-type dopant at a low concentration is performed on the device region of the silicon wafer 1. As a result, LDDs (lightly doped drains) 5 are formed on the device region of the silicon wafer 1, and side walls 6 are formed to both sides of the gate oxide layer 3 and the gate electrode 4.

Following this operation, a conducting dopant identical to that used for the LDDs 5 is ion-injected at a high concentration on the device region of the silicon wafer 1 using the side walls 6 and the gate electrode 4 as a mask to thereby form a source/drain 7. A titanium silicide layer 8 is then formed on the source/drain 7 and also on the gate electrode 4 to reduce a contact resistance.

Subsequently, with reference to FIG. 1b, in order to form a liner layer that acts as an etch stop layer during etching to form contacts and also acts to prevent the diffusion of impurities from a BPSG layer into other elements, a silicon nitride layer 9 is formed over all exposed elements formed on the silicon wafer 1. The silicon nitride layer 9 is formed by PECVD (plasma enhanced chemical vapor deposition) and at a temperature of approximately 400 Å.

A large amount of approximately 20~30 mol % of hydrogen generated in the decomposition process of silane and ammonia is contained in the silicon nitride layer 9. The hydrogen reacts with a BPSG layer formed in a subsequent process to ionize impurities. That is, the large amount of hydrogen contained in the silicon nitride layer 9 formed by PECVD exists in various forms such as combined with silicon (Si—H, Si—H2, Si—H3) and combined with nitrogen (N—H, NH2). The cohesive strength when combined with silicon, and particularly in Si—H, is especially weak such that these elements are easily separated when receiving an external chemical shock.

Subsequently, with reference to FIG. 1c, a BPSG layer 10 is formed as a pre-metal dielectric layer on the silicon nitride layer 9. The BPSG layer 10 is formed to a thickness of approximately 14,000 Å using SACVD (subatmospheric CVD) and at a temperature of 500° C. To increase the strength of the BPSG layer 10, heat treating is performed at 700° C. to realize densification.

With respect to the BPSG layer 10 prior to densification, the bond between boron and oxygen (B—O), phosphorus and oxygen (P—O), and silicon and oxygen (Si—O) is weak such that it is easily broken by external chemical and/or mechanical shock. Therefore, the BPSG layer 10 is densified to increase (by approximately three times) its chemical and mechanical strength.

However, with the formation of the BPSG layer 10, Si—H makes contact with the B—O, P—O, and Si—O to react with the same in a state where the Si—H close to the surface of the silicon nitride layer 9 receives the thermal energy of the 500° C. used to deposit the BPSG layer such that its cohesive strength weakens. As a result, hydrogen combines with oxygen, and boron ions (B+), phosphorous ions (P+), and silicon ions (Si+) are generated.

The boron ions, in particular, diffuse into the silicon nitride layer 9 because of their small atomic radius and superior mobility. As a result, the boron ions exist on the interfacial surface of the titanium silicide layer 8 or are left remaining within the silicon nitride layer 9 such that the boron ions diffuse into the silicon wafer 1 during the heat treating process to perform densification of the BPSG layer 10.

Boron diffused in this manner, and in particular, in the PMOS using boron as impurities of the source and drain, acts to reduce the threshold voltage of the same. It is also possible for the boron to cause current leakage. That is, a channel is not removed even with the elimination of an applied voltage for the removal of a gate channel, and the channel is instead weakly formed to thereby cause current leakage.

Conventional arts related to such diffusion are disclosed in U.S. Pat. Nos. 6,475,847, and 6,420,752.

SUMMARY OF THE INVENTION

In one exemplary embodiment of the present invention, there is provided a method for manufacturing a MOS (metal oxide semiconductor) transistor that prevents the diffusion of boron ions into a silicon wafer during formation of a BPSG (layer, the BPSG layer being formed by SACVD on a silicon nitride layer, which in turn is formed by PECVD.

In an exemplary embodiment of the present invention, a method for manufacturing a semiconductor device includes forming a barrier layer on an individual device formed on a semiconductor substrate and including a MOS transistor. An ozone process is performed on the barrier layer, and a pre-metal dielectric (PMD) layer is then formed on the barrier layer.

The ozone process performed on the barrier layer is performed at a temperature at which ozone is resolved, which is 500° C. Also, the resolved ozone is bonded with a surface of the barrier layer to stabilize the surface of the barrier layer.

The ozone process performed on the barrier layer is preferably performed for 10~30 seconds, and the ozone process performed on the barrier layer is preferably performed in a deposition chamber of the PMD layer. Also, a temperature at which the ozone process is performed and a deposition temperature of the PMD layer are preferably substantially identical.

Preferably, the PMD layer is heat treated following the formation of the PMD layer, and the heat treating is performed at a temperature of 600~800° C. and for 30~50 seconds.

Preferably, the barrier layer is a silicon nitride layer, the silicon nitride layer is formed to a thickness of 200~400 Å, and the silicon nitride layer is formed by plasma enhanced chemical vapor deposition.

The PMD layer is preferably formed of a material including boron. As an example, the PMD layer is formed of boron phosphorous silicate glass (BPSG) to thereby form a BPSG layer. The BPSG layer may be formed to a thickness of 10,000~20,000 Å, by subatmospheric chemical vapor deposition (SACVD).

The ozone process performed on the barrier layer may be performed in an SACVD chamber.

BRIEF DESCRIPTION OF THE DRAWINGS

The accompanying drawings, which together with the specification, illustrate an exemplary embodiment of the present invention, and, together with the description, serve to explain the principles of the present invention.

DETAILED DESCRIPTION

An exemplary embodiment of the present invention will now be described in detail with reference to the accompanying drawings.

FIGS. 2a through 2d are sectional views used to describe a method for manufacturing a MOS transistor according to an exemplary embodiment of the present invention.

Figure 1A:
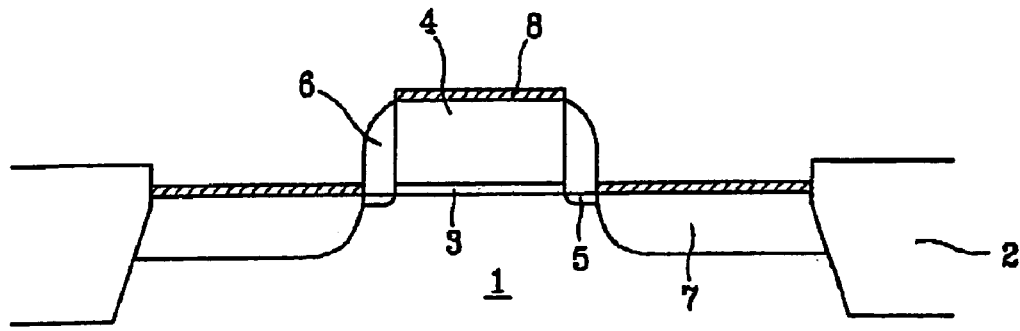
FIGS. 1a through 1c are sectional views used to describe a conventional method of manufacturing a MOS transistor.
Figure 1B:
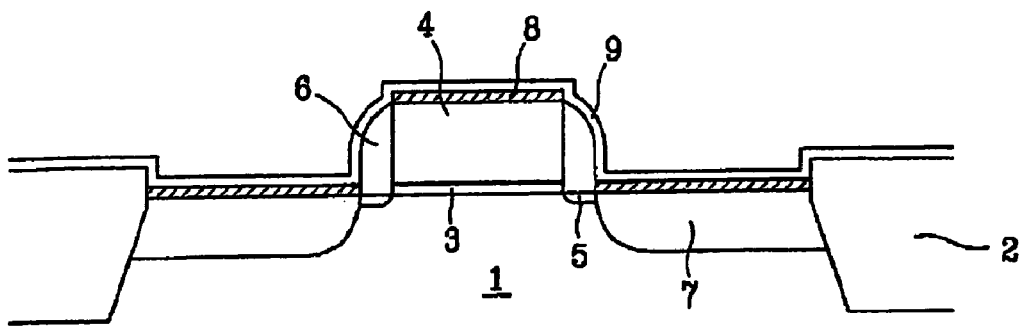
Figure 1C:
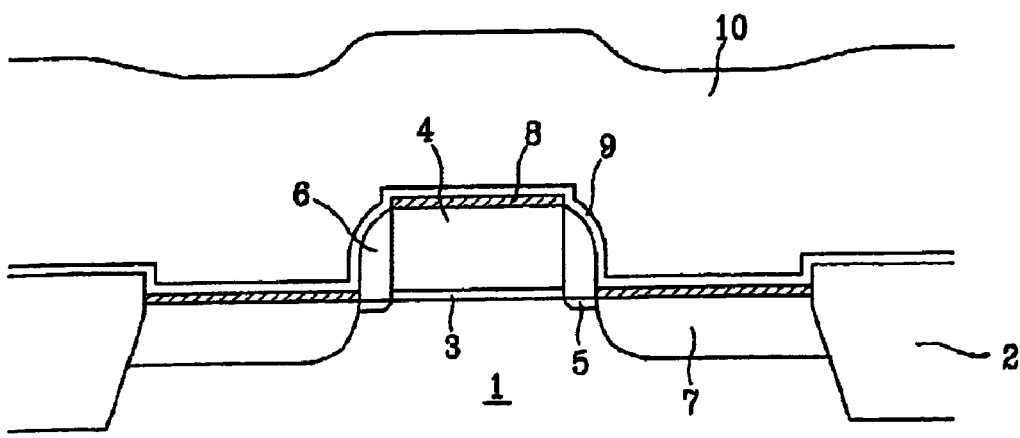
Figure 2A:
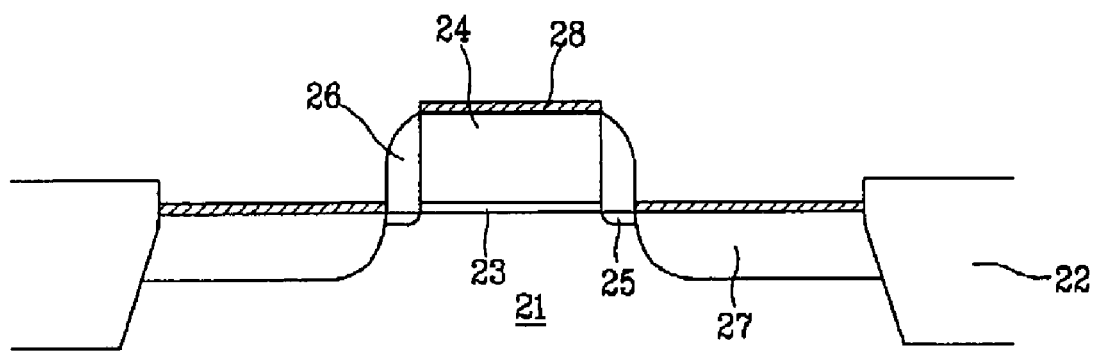
FIGS. 2a through 2d are sectional views used to describe a method for manufacturing a MOS transistor according to an exemplary embodiment of the present invention.

As shown in FIG. 2a, a field oxide layer 22 is formed on a predetermined region of a silicon wafer 21 through a LOCOS (local oxidation of silicon) process or a trench process. An area of the silicon wafer 21 on which the field oxide layer 22 is formed is referred to as a device isolation region, while the remainder of the silicon wafer 21 is referred to simply as a device region.

Next, thermal oxidation of the silicon wafer 21 is performed to grow a gate oxide layer 23 on a surface of the device region of the silicon wafer 21. Polysilicon is then deposited over all exposed elements of the silicon wafer 21, then the polysilicon and the gate oxide layer 23 are patterned to a predetermined width. A gate electrode 24 is formed by patterning the polysilicon.

Using the gate electrode 24 as a mask, ion injection of a p-type or n-type dopant is performed in the device region of the silicon wafer 21 such that LDDs (lightly doped drains) 25 are formed on the silicon wafer 21, and side walls 26 are formed to both sides of the gate oxide layer 23 and the gate electrode 24. Following this procedure, ion injection of a conducting dopant identical to that used for the LDDs 25 is performed at a high concentration in the device region of the silicon wafer 21 using the side walls 26 and the gate electrode 24 as a mask. A source/drain 27 is formed through this process.

Subsequently, using a sputtering process, titanium is deposited to a thickness of approximately 300~500 Å over the entire surface of the silicon wafer 21, then rapid thermal processing (RTP) is performed for 20~40 seconds and at a temperature of approximately 700~800° C. while flowing nitrogen at a flow rate of 50 sccm.

A titanium silicide layer 28 is formed by the reaction between the titanium and silicon. That is, the silicon of the gate electrode 24 and the source/drain 27 reacts with the titanium to form the titanium silicide 28. Since the silicon does not react with the titanium of the side walls 26 and the field oxide layer 22, the titanium on these elements is left remaining as non-reacted titanium. The non-reacted titanium is removed using a solvent so that it does not interfere with device operation.

Figure 2B:
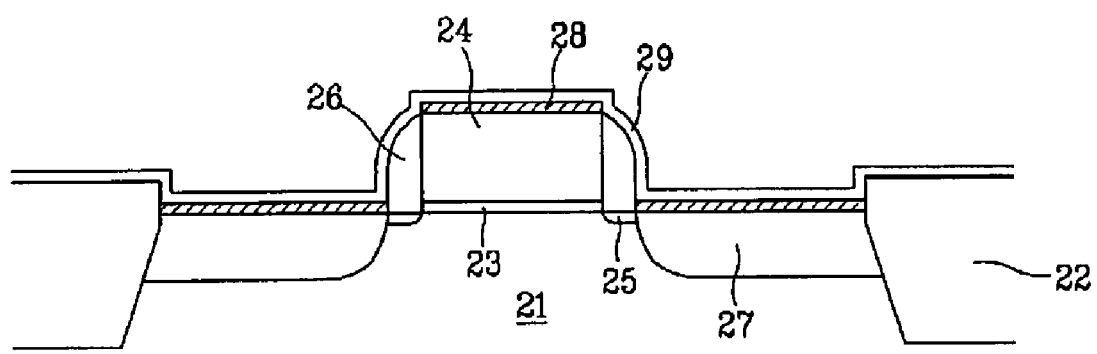

Subsequently, with reference to FIG. 2b, in order to form a barrier layer that acts as an etch stop layer during etching to form contacts and also acts to prevent the diffusion of impurities from a BPSG layer into other elements, a silicon nitride layer 29 is formed over all exposed elements formed on the silicon wafer 21. The silicon nitride layer 29 is formed by PECVD (plasma enhanced chemical vapor deposition) to a thickness of approximately 200~400 Å, preferably 300 Å.

Figure 2C:
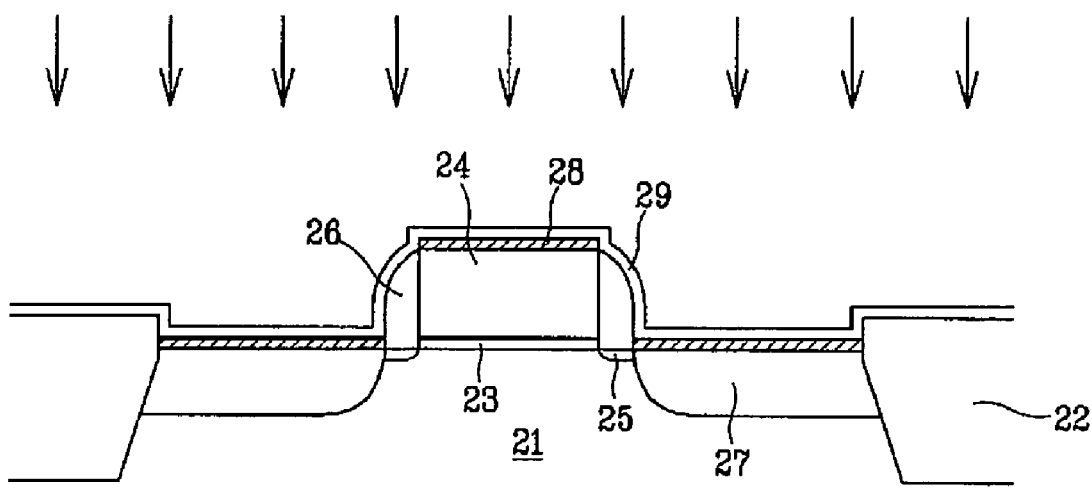

Next, with reference to FIG. 2c, prior to depositing a BPSG layer as a pre-metal dielectric layer on the silicon nitride layer 29 by SACVD (subatmospheric CVD), an ozone ($O_3$) process is performed for 10~30 seconds (preferably 20 seconds) at a temperature of approximately 500° C. By performing the ozone process, hydrogen in the Si—H, which has a weak bond, is removed in the vicinity of a silicon nitride surface, and partly replaced with oxygen.

The ozone process may be performed at the same temperature as the temperature used to deposit the pre-metal dielectric layer and in the same chamber in which the pre-metal dielectric layer is deposited. However, a different temperature and a different chamber may also be used. If the ozone process is performed in an SACVD deposition chamber, that is, the chamber in which a BPSG layer is deposited, the BPSG layer may be formed immediately following the ozone process. As a result, contact with air outside the chamber, which may act as an additional supply of hydrogen, is prevented such that greater stability of boron is realized.

Figure 2D:
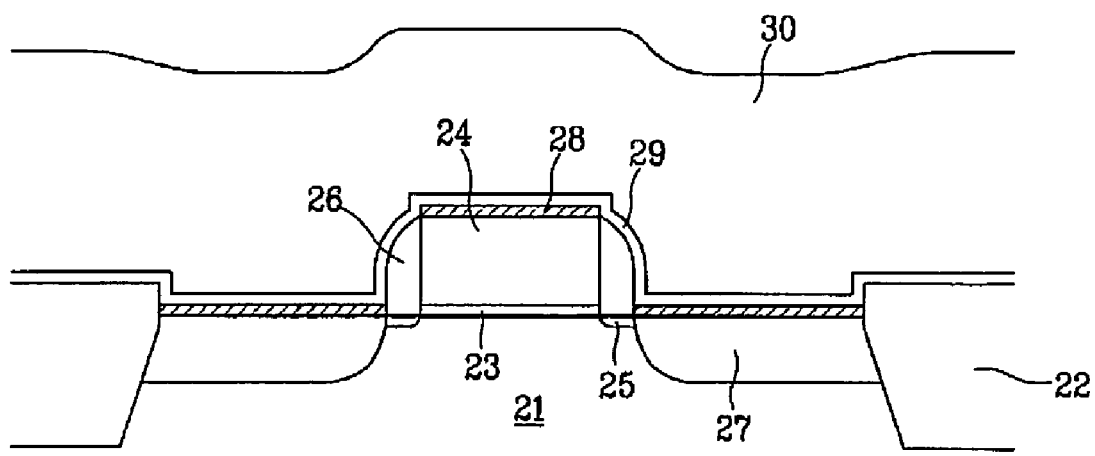

Subsequently, with reference to FIG. 2d, a BPSG layer 30 is deposited to a thickness of approximately 10,000~20,000 Å using SACVD. SACVD is performed at a temperature of approximately 500° C. and a pressure of approximately 200 Torr. To increase the strength of the BPSG layer 30, heat treating is performed at a temperature of 600~800° C. and for 30~50 seconds to realize densification.

If the ozone process is performed in an SACVD deposition chamber, the BPSG layer 30 may be formed in the same deposition chamber without interruption, in which case a source gas for forming the BPSG layer 30 is injected into the SACVD deposition chamber following the ozone process.

With the formation of the BPSG layer 30, hydrogen is removed from the surface of the silicon nitride layer 29 such that the surface is easily covered with B—O, P—O, and Si—O, and a relatively strong covalent bond is realized. Also, greater stability is realized following the heat treating process (performed for densification). In the case of B—O in particular, a compound approximating B2O3 is realized following the heat treating process.

As described above, the ozone process is performed following the formation of the silicon nitride layer 29 and prior to the formation of the BPSG layer 30 to thereby remove hydrogen. As a result, the B—O bond in the BPSG layer 30 is strengthened to enhance the stability of boron. This, in turn, prevents boron ions from diffusing into the silicon wafer 21.

Further, since the BPSG layer 30 may be formed in the same SACVD deposition chamber that the ozone process is performed in, that is, since the BPSG layer 30 may be formed without interruption following the ozone process, contact with the air outside the chamber is prevented. This isolation of the silicon wafer 21 from the air, which is a supply source for hydrogen, prevents the situation where boron ions are generated as a result of the presence of hydrogen. Ultimately, the leakage of current resulting from the diffusion of boron ions into the silicon wafer 21 does not occur, and the resulting degradation of the transistor is prevented.

Although an embodiment of the present invention has been described in detail hereinabove in connection with a certain exemplary embodiment, it should be understood that the invention is not limited to the disclosed exemplary embodiment, but, on the contrary is intended to cover various modifications and/or equivalent arrangements included within the spirit and scope of the present invention, as defined in the appended claims.

What is claimed is:

1. A method for manufacturing a semiconductor device, comprising:
   forming a barrier layer on an individual device formed on a semiconductor substrate, and that includes a MOS transistor;
   performing an ozone process on the barrier layer; and
   forming a pre-metal dielectric (PMD) layer on the barrier layer that has undergone the ozone process,
   wherein the ozone process performed on the barrier layer is performed in a deposition chamber of the PMD layer.

2. The method of claim 1, wherein the ozone process performed on the barrier layer is performed at a temperature at which ozone is resolved.

3. The method of claim 2, wherein the temperature at which ozone is resolved is 500° C.

4. The method of claim 3, wherein the resolved ozone is bonded with surface of the barrier layer to stabilize the surface of the barrier layer.

5. The method of claim 1, wherein the ozone process performed on the barrier layer is performed for 10~30 seconds.

6. The method of claim 1, wherein a temperature at which the ozone process is performed and a deposition temperature of the PMD layer are substantially identical.

7. The method of claim 1, further comprising heat treating the PMD layer following the formation of the PMD layer.

8. The method of claim 7, wherein the heat treating is performed at a temperature of 600~800° C. for 30~50 seconds.

9. The method of claim 1, wherein the barrier layer is a silicon nitride layer.

10. The method of claim 9, wherein the silicon nitride layer is formed to a thickness of 200~400 Å.

11. The method of claim 9, wherein the silicon nitride layer is formed by plasma enhanced chemical vapor deposition.

12. The method of claim 1, wherein the PMD layer is formed of a material including boron.

13. The method of claim 1, wherein the PMD layer is formed of boron phosphorous silicate glass (BPSG) to thereby form a BPSG layer.

14. The method of claim 13, wherein the BPSG layer is formed to a thickness of 10,000~20,000 Å.

15. The method of claim 13, wherein the BPSG layer is formed by subatmospheric chemical vapor deposition (SACVD).

16. The method of claim 15, wherein the ozone process performed on the barrier layer is performed in an SACVD chamber.

17. The method of claim 15, wherein the BPSG layer is formed in an SACVD chamber at a temperature of approximately 500° C.

18. The method of claim 17, wherein the ozone process performed on the barrier layer is formed in an SACVD chamber at a temperature of approximately 500° C.

19. The method of claim 15, wherein the BPSG layer is formed in an SACVD chamber at a pressure of approximately 200 Ton.

* * * * *